United States Patent
Jow et al.

(10) Patent No.: US 10,109,584 B2
(45) Date of Patent: Oct. 23, 2018

(54) PATTERNED GROUNDS AND METHODS OF FORMING THE SAME

(71) Applicant: QUALCOMM Incorporated, San Diego, CA (US)

(72) Inventors: Uei-Ming Jow, San Diego, CA (US);
Young Kyu Song, San Diego, CA (US);
Jung Ho Yoon, San Diego, CA (US);
Jong-Hoon Lee, San Diego, CA (US);
Xiaonan Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/474,860

(22) Filed: Sep. 2, 2014

(65) Prior Publication Data

US 2016/0066414 A1 Mar. 3, 2016

(51) Int. Cl.
*H01F 17/00* (2006.01)
*H01F 27/28* (2006.01)
(Continued)

(52) U.S. Cl.
CPC ........ *H01L 23/5286* (2013.01); *H01L 23/495* (2013.01); *H01L 23/49838* (2013.01);
(Continued)

(58) Field of Classification Search
None
See application file for complete search history.

(56) References Cited

U.S. PATENT DOCUMENTS

| 5,285,352 A | 2/1994 | Pastore et al. |
| 6,946,950 B1 | 9/2005 | Ueno et al. |

(Continued)

FOREIGN PATENT DOCUMENTS

| EP | 0938139 A2 | 8/1999 |
| WO | 0045420 A2 | 8/2000 |

OTHER PUBLICATIONS

Yin W.Y., "On-Chip EMC Issue: The Implementation of Patterned Ground Shields for Silicon Devices," IEEE 18th International Zurich Symposium on Electromagnetic Compatibility, Sep. 2007, pp. 9-12.

(Continued)

*Primary Examiner* — Shaun M Campbell
*Assistant Examiner* — Aneta B Cieslewicz
(74) *Attorney, Agent, or Firm* — Muncy, Geissler, Olds & Lowe, P.C./Qualcomm (57) ABSTRACT

A semiconductor package according to some examples of the disclosure may include a first body layer, a transformer that may comprise one or more inductors, coupled inductors, or inductive elements positioned above the first body layer. A first ground plane is on a top of the first body layer between the first body layer and the inductive element. The first ground plane may have conductive lines generally perpendicular to a magnetic field generated by the inductive element, and a second ground plane on a bottom of the first body layer opposite the first ground plane. The first and second ground planes may also provide heat dissipation elements for the semiconductor as well as reduce or eliminate eddy current and parasitic effects produced by the inductive element.

23 Claims, 9 Drawing Sheets

(51) Int. Cl.
*H01L 21/48* (2006.01)
*H01L 23/00* (2006.01)
*H01L 23/31* (2006.01)
*H01L 23/64* (2006.01)
*H01L 49/02* (2006.01)
*H01L 23/495* (2006.01)
*H01L 23/498* (2006.01)
*H01L 23/522* (2006.01)
*H01L 23/528* (2006.01)

(52) U.S. Cl.
CPC ........ *H01L 23/5227* (2013.01); *H01L 23/645* (2013.01); *H01L 28/10* (2013.01); *H01F 27/2804* (2013.01); *H01F 2017/0086* (2013.01); *H01L 21/4828* (2013.01); *H01L 23/3121* (2013.01); *H01L 23/49548* (2013.01); *H01L 24/13* (2013.01); *H01L 24/16* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/131* (2013.01); *H01L 2224/16227* (2013.01); *H01L 2224/16245* (2013.01); *H01L 2224/2919* (2013.01); *H01L 2224/32245* (2013.01); *H01L 2224/45144* (2013.01); *H01L 2224/48091* (2013.01); *H01L 2224/48247* (2013.01); *H01L 2224/73265* (2013.01); *H01L 2924/10253* (2013.01); *H01L 2924/14* (2013.01); *H01L 2924/15313* (2013.01); *H01L 2924/181* (2013.01); *H01L 2924/19042* (2013.01); *H01L 2924/30105* (2013.01); *H01L 2924/30107* (2013.01)

(56) References Cited

U.S. PATENT DOCUMENTS

| | | | | |
|---|---|---|---|---|
| 6,960,824 B1* | 11/2005 | Hashemi | ............ | H01L 23/3677 257/698 |
| 8,310,024 B2 | 11/2012 | Reefman et al. | | |
| 2002/0074620 A1* | 6/2002 | Yue | ........................ | H01F 27/362 257/531 |
| 2002/0167084 A1* | 11/2002 | Coccioli | ............ | H01L 23/3677 257/732 |
| 2004/0183156 A1* | 9/2004 | Lowther | ................. | H01L 28/10 257/531 |
| 2007/0281438 A1* | 12/2007 | Liu | ..................... | H01L 23/5225 438/455 |
| 2009/0321876 A1 | 12/2009 | Kamgaing | | |
| 2012/0299150 A1 | 11/2012 | Tang et al. | | |

OTHER PUBLICATIONS

International Search Report and Written Opinion—PCT/US2015/047953—ISA/EPO—dated Apr. 19, 2016.
Partial International Search Report—PCT/US2015/047953—ISA/EPO—dated Dec. 9, 2015.

* cited by examiner

PATTERNED GROUNDS AND METHODS OF FORMING THE SAME

FIELD OF DISCLOSURE

This disclosure relates generally to semiconductor package grounds, and more specifically, but not exclusively, to patterned grounds for semiconductor packages.

BACKGROUND

In a conventional quad-flat no-leads (QFN) package, bumps or copper pillars separate a chip containing an inductive element from a package body containing a metal package ground. These pillars or bumps are short and result in little separation between the chip and the metal package ground. The inductive element generates a magnetic field that induces or causes eddy currents in the metal package ground. The magnitude of the induced eddy currents is dependent, in part, on the distance separating the source of the magnetic field (the inductive element) and the metal package ground. The induced eddy currents are problematic because they have a parasitic effect and degrade the performance of the inductive element. By adding a hollow space in the package under the inductive element and between the inductive element and the metal package ground, the performance of the inductive element can be improved due to the increased separation of the inductive element and metal package ground. However, this design degrades the heat dispassion capabilities of the package. Accordingly, there is a need for integrated circuit package structures and methods that improve upon conventional methods by reducing the induced eddy currents while providing improved heat dissipation.

The inventive features that are characteristic of the teachings, together with further features and advantages, are better understood from the detailed description and the accompanying figures.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

Some examples of the disclosure are directed to systems, apparatus, and methods for a patterned ground design under the inductors or inductive elements, for example, the coupled inductors in a transformer of a semiconductor package. The patterned ground eliminates or substantially reduces the eddy current associated with the inductors or transformers and also provides better heat dissipation of heat generated by various components in a semiconductor package.

In some examples of the disclosure, the system, apparatus, and method include a metal layer, an inductive element positioned above the metal layer, a first ground plane adjacent the inductive element, the first ground plane having conductive lines generally perpendicular to a magnetic field generated by the inductive element; and a second ground plane.

Other features and advantages associated with the apparatus and methods disclosed herein will be apparent to those skilled in the art based on the accompanying drawings and detailed description.

BRIEF DESCRIPTION OF THE DRAWINGS

The accompanying drawings are presented to describe examples of the present teachings, and are not limiting. The accompanying drawings are presented to aid in the description of examples of the disclosure and are provided solely for illustration of the examples and not limitation thereof.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein advantageously provide an integrated circuit package having an inductive element, such as within a transformer, and a ground plane that is patterned into a shape with conductive lines generally perpendicular to a magnetic field generated by the inductive element. The shape and perpendicular orientation of the conductive lines of the patterned ground inhibit eddy currents created by the magnetic field generated by the inductive element, for example, coupled inductors in transformers in the package and also provide a thermal pathway to dissipate heat generated by components in the integrated circuit package. The patterned ground plane's perpendicular orientation provides a counteracting effect that inhibits eddy currents while the dimensions and ratios of the width of the patterned ground plane may be sized to optimize this effect. The patterned ground structure may include a central conductive line or, alternatively, a central gap. A central gap may provide additional heat resistance for the patterned ground structure while a central conductive line may provide an additional thermal pathway and increase the counteracting effect.

Since the magnitude of the eddy currents induced in the patterned ground plane is determined, in part, by the distance between the patterned ground plane and the inductive element (the source of the magnetic field), such as in a transformer, the patterned ground plane may be spaced from the inductive element to increase the distance between the two elements. By increasing the distance separating the two elements, the induced eddy currents can be reduced or eliminated. The separation may be accomplished by an air gap or the inclusion of a dielectric material between the two elements.

The integrated circuit package may also include a body layer with the first ground plane on one surface and a second ground plane on an opposite surface. The addition of the second ground plane increases the thermal paths for dissipation of heat generated by the integrated circuit package. With the addition of a second ground plane, thermal pathways in the body layer may be provided. The thermal pathways in the body layer may be vias that thermally couple the first ground plane and the second ground plane. These vias can be hollow, providing only a thermal pathway, or filled with electrically conductive material that electrically and thermally couples the first ground plane and the second ground plane.

Various aspects are disclosed in the following description and related drawings to show specific examples relating to the disclosure. Alternate examples will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and examples disclosed herein.

The word "exemplary" is used herein to mean "serving as an example, instance, or illustration." Any example described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

The patterned ground structures disclosed herein may be used in a number of different semiconductor packages, such as wafer level packages, flip chip packages, LGA packages, and QFN packages to name just a few. For example, the patterned grounds disclosed herein may be used in QFN packages of the type shown in FIG. 1.

Figure 1:
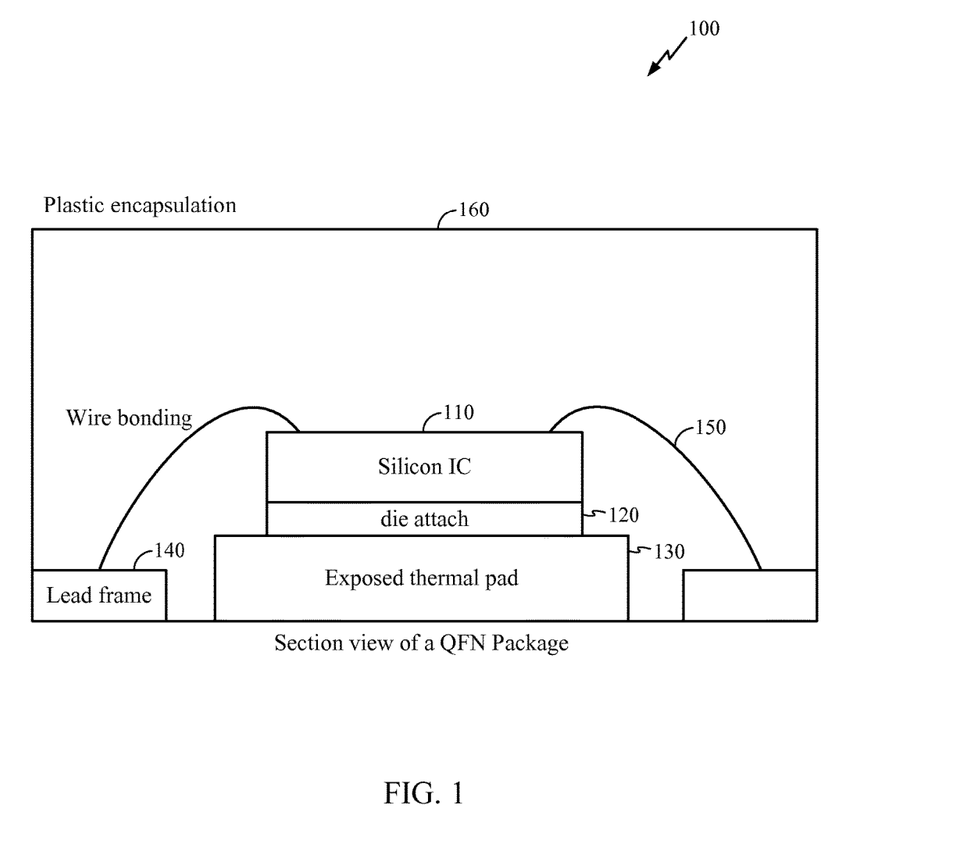
FIG. 1 depicts a section view of a QFN package.

Referring now to FIG. 1, a QFN package 100 includes a silicon integrated circuit 110 with ground, die attachment 120, exposed thermal pad 130, a lead frame 140, wire bonding 150, and a plastic encapsulation 160 enclosing the package. The lead frame 140 may be made of a copper alloy and a thermally conductive adhesive 120 may be used for attaching the silicon IC 110 to the thermal pad 130. The silicon die 110 may be electrically connected to the lead frame 140 by, for example, 1-2 mil diameter or 20-50 micrometer diameter gold wires 150.

Figure 2:
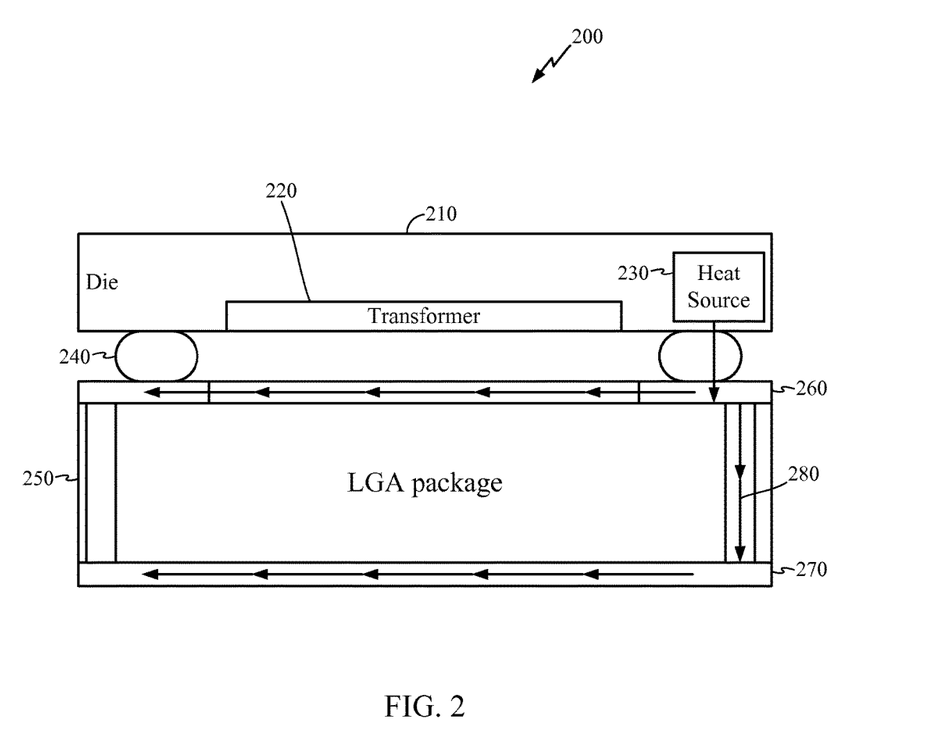
FIG. 2 depicts a block diagram of a land grid array (LGA) package.

FIG. 2 depicts an LGA package. In FIG. 2, a semiconductor package 200 may include a die 210, a transformer or means 220 for transferring energy embedded in the die 210, a heat source 230 to conceptually represent the various components and/or integrated circuits in the die 210 that are generating heat when power is applied to them, solder balls 240, a package substrate 250, a first ground structure 260, a second ground structure 270, and thermal vias 280. The thermal vias 280 may provide a heat transfer path from the first ground structure 260 to the second ground structure 270. Heat dissipation for the heat generated by heat source 230, such as an active region of the die 210, may be provided by a combination of the first ground structure 260, thermal vias 280, and the second ground structure 270 as well as additional on-package and off-package components (not shown). The heat source 230 is shown as a discrete element within the die 210, but is should be understood that the heat source 230 represents any region, component, or element of the die 210 that generates heat. For instances, when a region of die 210 is active or operational (drawing current), that region will produce heat that should be dissipated. To aid in the heat transfer and dissipation capabilities of these components, the first ground structure 260, thermal vias 280, and the second ground structure 270 may be composed of thermally conductive material, such as metal and metal alloys. Due to the short distance between die 210 and the first ground structure 260, eddy currents and parasitic capacitance may be produced in the first ground structure 260. By using the ground structures described herein, those effects can be eliminated or minimized.

Figure 3:
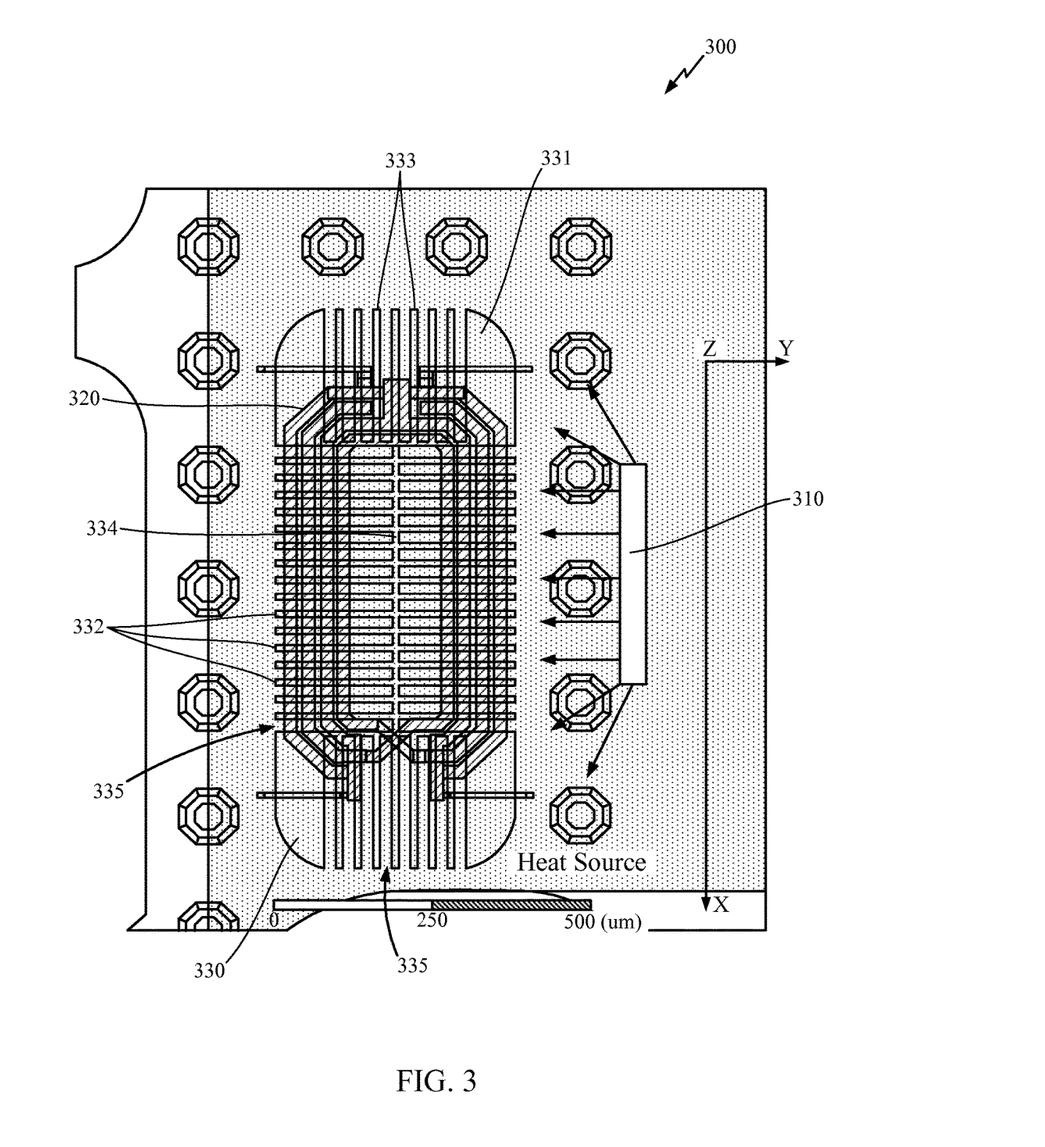
FIG. 3 depicts a top view of an exemplary patterned ground.

In accordance with some examples of the disclosure, FIG. 3 depicts a patterned ground structure with a central conductive line or ridge. As shown in FIG. 3, a semiconductor package 300 may include a heat source 310 to conceptually represent heat generated by one or components of the package 300, such as an active region of a die (not shown), during operation, a transformer or means 320 for transferring energy of the semiconductor package, and a first ground structure or means 330 for grounding electrical current. The heat source 310 and transformer 320 may be located in the die and positioned above the ground structure 330 in the z-direction. As shown, the heat source 310 is offset from the ground structure 330 in the y-direction while the transformer 320 is positioned directly above the ground structure 330, but it should be understood that both the transformer element 320 and heat source 310 may be positioned over the ground structure 330, offset to one side, or offset to opposite sides of the ground structure 330. The transformer element 320 may comprise one or more inductors or inductive elements, such as coupled inductors, to transfer energy from one component to another in the package 300.

The ground structure 330 may include a main body or means 331 for providing support, a plurality of conductive lines or ridges 332 extending in the y-direction, a plurality of conductive lines or ridges 333 extending in the x-direction, and a central conductive line or ridge 334. The plurality of conductive lines or ridges 332-334 may be separate by gaps 335 and oriented perpendicular to the current flow in windings of the transformer 320 positioned over the respective conductive lines or ridges 332-333. The perpendicular orientation of the conductive lines or ridges 332-334 and gaps 335 may be configured and sized to increase the dampening effect of the ground structure 330 on eddy currents and parasitic capacitance produced by transformer 320 while still providing heat dissipation for the heat produced by the heat source 310. The number, size and configuration of the conductive lines or ridges 332-334 and gaps 335 may be based on the amount of current and/or the size of the transformer 320 coils.

Figure 4:
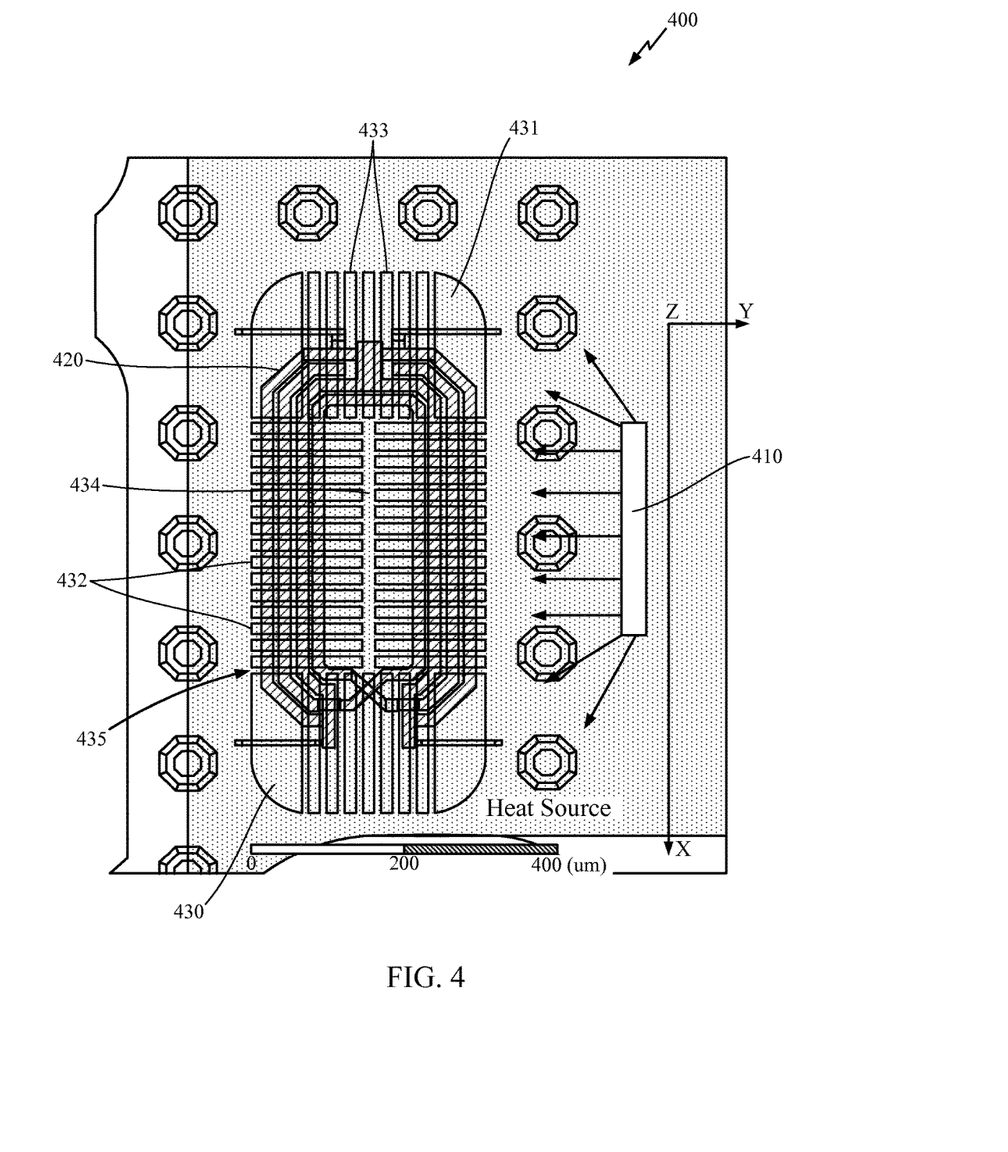
FIG. 4 depicts a top view of an exemplary patterned ground.

Although not shown, a second ground structure or means for grounding electrical current may be included. The second ground structure may be patterned similar to the first ground structure or may be a solid body that provides additional area for heat dissipation and storage. The second ground structure may be on an opposite side of a substrate from the first ground structure. The area of the first and second ground planes may be larger or smaller than the area of the transformer or inductive element In accordance with some examples of the disclosure, FIG. 4 depicts a patterned ground structure with a central gap. As shown in FIG. 4, a semiconductor package 400 may include a heat source 410 to conceptually various components of the package 400 that may be generating heat, such as an active region of the die (not shown), a transformer or means 420 for transferring energy of the semiconductor package, and a first ground structure or means 430 for grounding electrical current. The heat source 410 and transformer 420 may be located in the die and positioned above the ground structure 430 in the z-direction. As shown, in one example, the heat source 410 is offset from the ground structure 430 in the y-direction while the transformer 420 is positioned directly above the ground structure 430, but is should be understood that both the transformer 420 and heat source 410 may be positioned over the ground structure 430, offset to one side, or offset to opposite sides of the ground structure 430. The transformer 420 may comprise one or more inductors, coupled inductors, or inductive elements to transfer energy.

The ground structure 430 may include a main body or means 431 for providing support, a plurality of conductive lines or ridges 432 extending in the y-direction, a plurality of conductive lines or ridges 433 extending in the x-direction, and a central gap 434. The plurality of conductive lines or ridges 432 and 433 may be separate by gaps 435 and oriented perpendicular to the current flow in windings of the transformer 420 positioned over the respective conductive lines or ridges 432 and 433. The perpendicular orientation of the conductive lines or ridges 432-433 and gaps 434-435 are configured and may be sized to increase the dampening effect of the ground structure 430 on eddy currents and parasitic capacitance produced by transformer or means 420 while still providing heat dissipation for the heat produced by the heat source 410. The number, size and configuration of the conductive lines or ridges 432-433 and gaps 434-435 may be based on the amount of current and/or the size of the transformer 420 coils.

Figure 5:
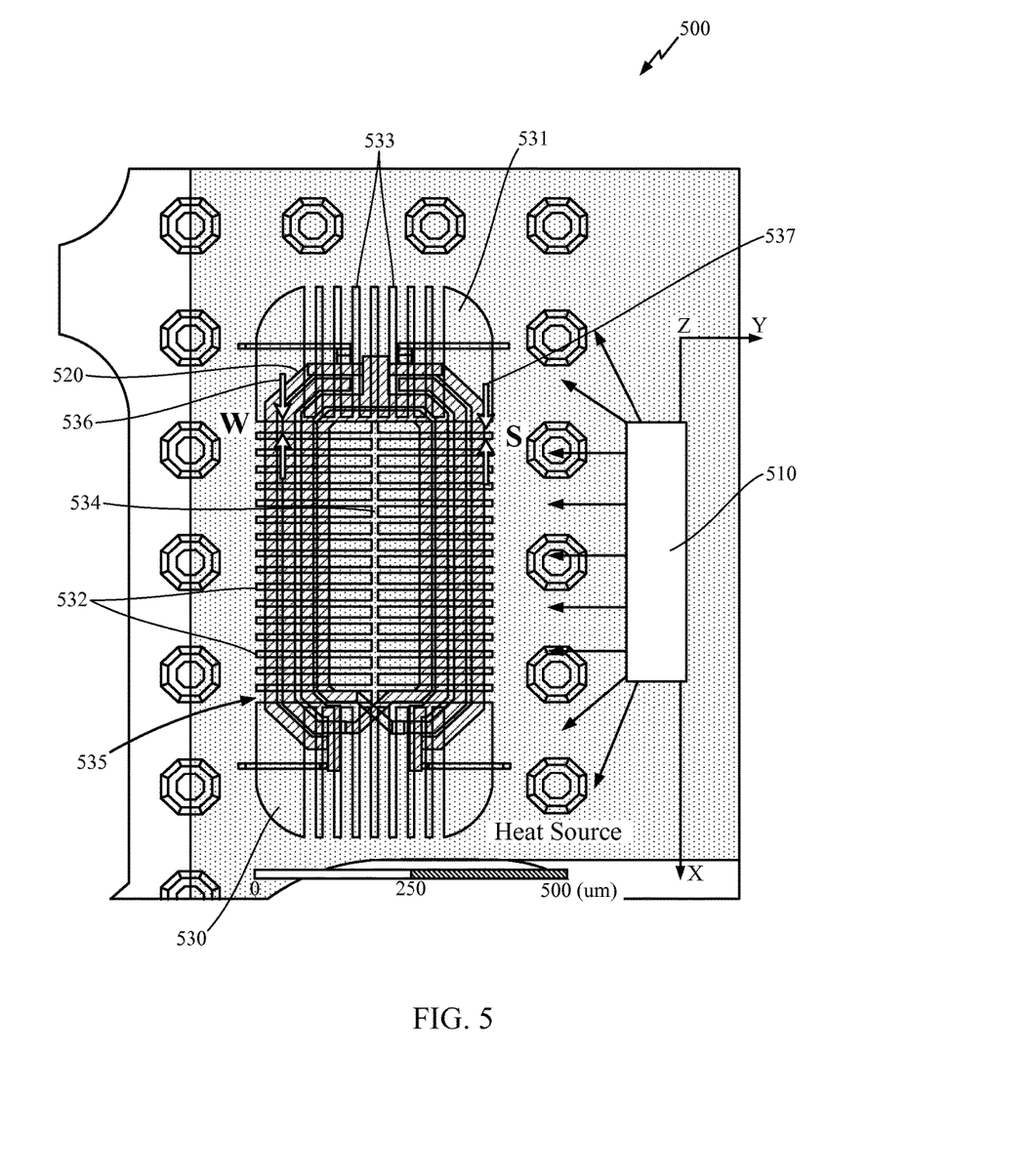
FIG. 5 depicts a top view of an exemplary patterned ground.

In accordance with some examples of the disclosure, FIG. 5 depicts a patterned ground structure with variable width conductive lines or ridges and variable width gaps between and separating the conductive lines or ridges. As shown in FIG. 5, a semiconductor package 500 may include various components that generate heat during operation that are illustrated as heat source 510, such as an active region of the die (not shown), a transformer or means 520 for transferring energy of the semiconductor package, and a first ground structure or means 530 for grounding electrical current. The heat source 510 and transformer 520 may be located in the die and positioned above the ground structure 530 in the z-direction. As shown, the heat source 510 is offset from the ground structure 530 in the y-direction while the transformer 520 is positioned directly above the ground structure 530, but is should be understood that both the transformer 520 and heat source 510 may be positioned over the ground structure 530, offset to one side, or offset to opposite sides of the ground structure 530. The transformer 520 comprises one or more inductors or inductive elements.

The ground structure 530 may include a main body or means 531 for providing support, a plurality of conductive lines or ridges 532 extending in the y-direction, a plurality of conductive lines or ridges 533 extending in the x-direction, and a central conductive line or ridge 534. The plurality of conductive lines or ridges 532-534 may be separated by gaps 535 and oriented perpendicular to the current flow in windings of the transformer 520 positioned over the respective conductive lines or ridges 532-533. The perpendicular orientation of the conductive lines or ridges 532-534 and gaps 535 may be configured and sized to increase the dampening effect of the ground structure 530 on eddy currents and parasitic capacitance produced by transformer 520 while still providing heat dissipation for the heat produced by the heat source 510. The number, size and configuration of the conductive lines or ridges 532-534 and gaps 535 may be based on the amount of current and/or the size of the transformer 520 coils.

Figure 6:
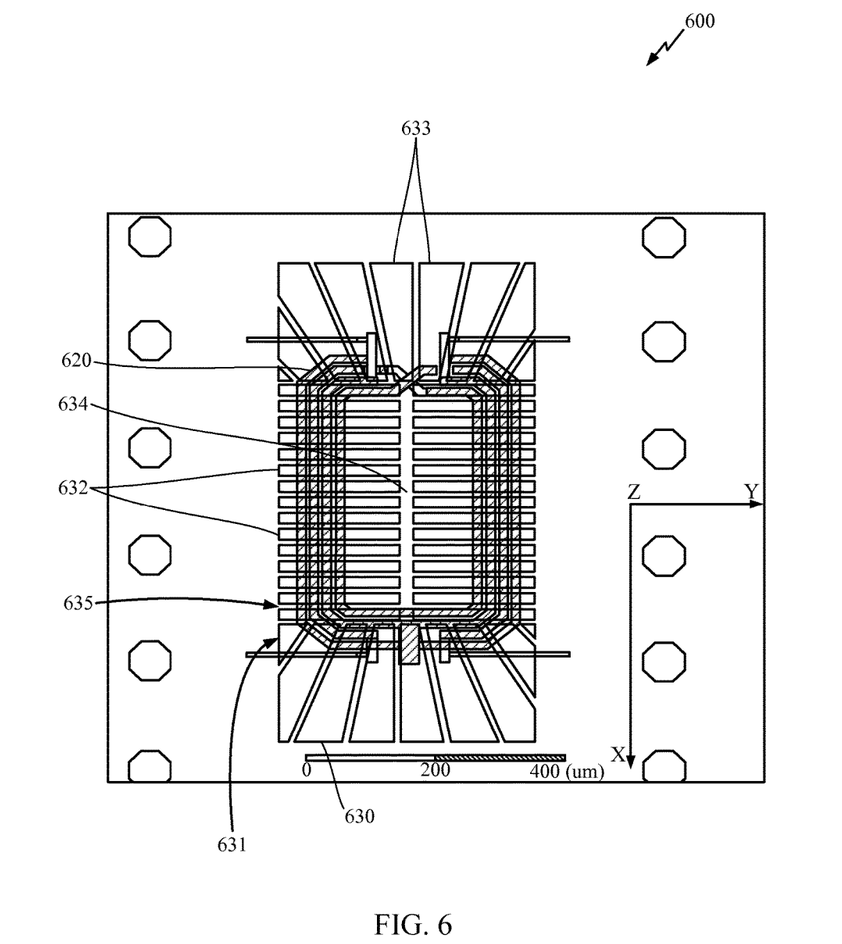
FIG. 6 depicts a top view of an exemplary patterned ground.

While the shape and size of conductive lines or ridges 532-534 are shown as approximately uniform, the shape and sizes may be varied on an individual basis such that, for example, the size and shape of conductive lines or ridges 532 is different from conductive lines or ridges 533 and 534, each set of conductive lines or ridges 532-534 may be different from each other set, and each individual ridge 532-534 may be different from each other individual ridge as well as combinations of the above (see, for example, FIG. 6). The metal area occupied by components of the ground structure 530 may be balance about the central conductive line or ridge 534 so that the metal area is equally distributed across the ground structure 530. This provides an even distribution of the dampening effect and thermal dissipation characteristics and avoids local "hot spots". Additionally, the metal area of the ground structure 530 may be balanced with the metal area of an optional second ground structure. This too will improve the thermal dissipation characteristics and avoid local "hot spots" by maintaining a balance distribution of metal density.

The width (W) 536 in the x-direction of gaps 535 and the width (S) 537 in the x-direction of conductive lines or ridges 532 may be of various dimensions and may be uniform or non-uniform. For example, the widths 536 and 537 may be:
- W (536)=10 um; S (537)=5 um
- W (536)=10 um; S (537) s=10 um
- W (536)=10 um; S (537)=20 um
- W (536)=20 um; S (537)=5 um
- W (536)=20 um; S (537)=10 um
- W (536)=20 um; S (537)=20 um By varying the width of the gaps 535 and conductive lines or ridges 532, the resulting dampening and dissipation effects can be varied. For example, the table below illustrates the impact on the performance of the inductive element due to the various widths described above with 'pri' meaning primary coil; 'sec' meaning secondary coil; and 'kd' meaning coupling coefficient at 5.5 GHz.

|  | L_pri µH | L_sec µH | Q_pri | Q_sec | kd |
|---|---|---|---|---|---|
| W10_S5 | 2.272 | 0.736 | 17.587 | 24.729 | 0.520 |
| W10_S10 | 2.372 | 0.756 | 18.870 | 26.234 | 0.533 |
| W10_S20 | 2.475 | 0.780 | 20.552 | 28.571 | 0.545 |
| W20_S5 | 2.180 | 0.712 | 19.301 | 27.165 | 0.507 |
| W20_S10 | 2.261 | 0.730 | 19.943 | 28.013 | 0.521 |
| W20_S20 | 2.369 | 0.750 | 20.820 | 28.854 | 0.537 |

In accordance with some examples of the disclosure, FIG. 6 depicts a patterned ground structure with conductive lines or ridges in the x-direction shaped and sized differently than conductive lines or ridges in the y-direction. As shown in FIG. 6, a semiconductor package 600 may include various components that generate heat during operations and may be viewed as a heat source, such as an active region of the die (not shown), a transformer or means 620 for transferring energy of the semiconductor package, and a first ground structure or means 630 for grounding electrical current. The heat source and transformer 620 may be located in the die and positioned above the ground structure 630 in the z-direction. As shown, the transformer 620 is positioned directly above the ground structure 630, but is should be understood that the transformer 620 may be positioned over the ground structure 630 or offset to one side. The transformer 620 may comprise one or more inductors, coupled inductors, or inductive elements.

The ground structure 630 may include a main body or means 631 for providing support, a plurality of conductive lines or ridges 632 extending in the y-direction, a plurality of conductive lines or ridges 633 extending in the x-direction, and a central gap 634. The plurality of conductive lines or ridges 632 and 633 may be separate by gaps 635 and oriented perpendicular to the current flow in windings of the transformer 620 positioned over the respective conductive lines or ridges 632 and 633. The perpendicular orientation of the conductive lines or ridges 632-633 and gaps 634-635 are configured and may be sized to increase the dampening effect of the ground structure 630 on eddy currents and parasitic capacitance produced by transformer 620 while still providing heat dissipation for the heat produced by the heat source 610. The number, size and configuration of the conductive lines or ridges 632-633 and gaps 634-635 may be based on the amount of current and/or the size of the transformer 620 coils and need not be uniform or substantial similar.

Figure 7:
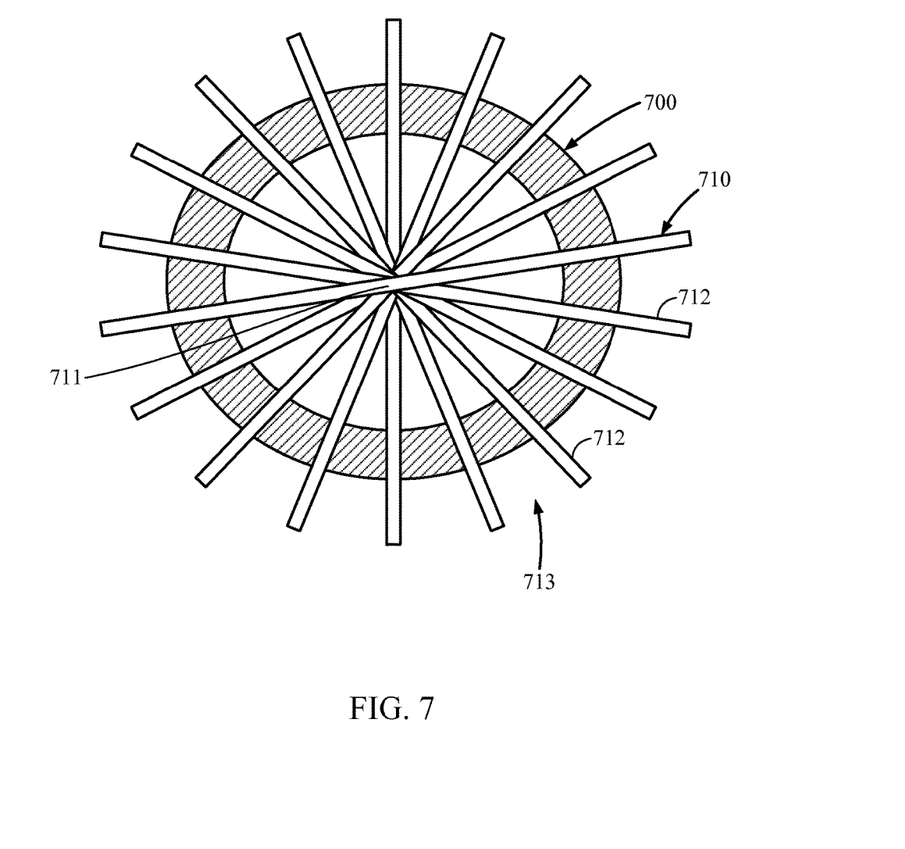
FIG. 7 depicts a top view of an exemplary patterned ground.

In accordance with some examples of the disclosure, FIG. 7 depicts a patterned ground structure for a spiral inductor that may be used in a transformer provided in a semiconductor package. As shown in FIG. 7, a transformer or means 700 for transferring energy may comprise a spiral shaped inductor and is positioned above a ground structure or means 710 for grounding electrical current. The ground structure 710 may include central hub 711, a plurality of spokes 712 radiating from hub 711, and a plurality of gaps 713 between the spokes 712. The spokes 712 and gaps 713 may be oriented perpendicularly to the current flow in the portion of inductor 700 positioned over the spokes 712 and gaps 713. The perpendicular orientation of the spokes 712 and gaps 713 are configured and may be sized to increase the dampening effect of the ground structure 710 on eddy currents and parasitic capacitance produced by the spiral inductor of the transformer 700 while still providing heat dissipation for the heat that may be produced by the inductor of the transformer 700 and/or a semiconductor package housing the inductor of the transformer 700 and ground structure 710. The number, size and configuration of the spokes 712 and gaps 713 may be based on the amount of current and/or the size of the inductor coils of the transformer 700 and need not be uniform or substantial similar.

Figure 8:
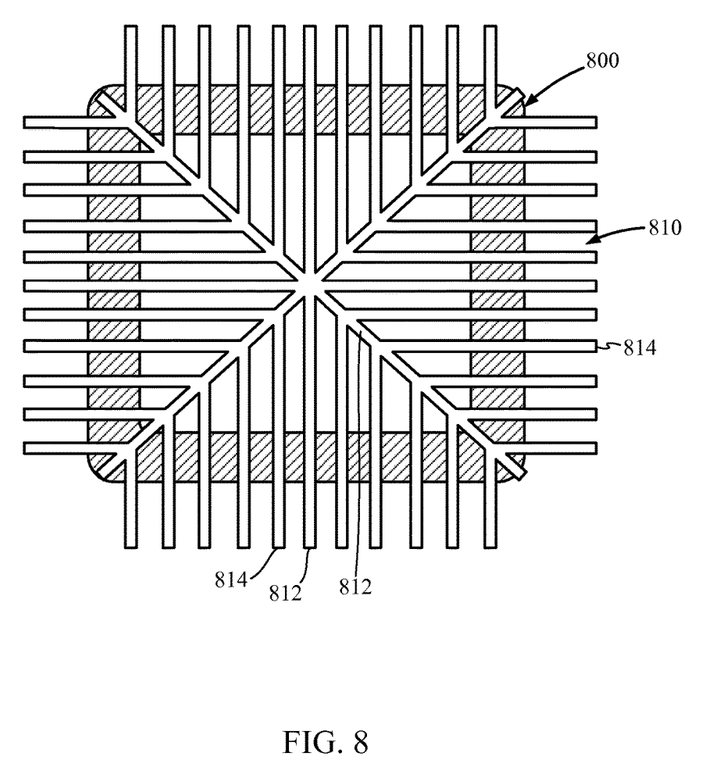
FIG. 8 depicts a top view of an exemplary patterned ground.

In accordance with some examples of the disclosure, FIG. 8 depicts a patterned ground structure for a transformer that uses a square-shaped inductor. As shown in FIG. 8, a square shaped transformer or means 800 for transferring energy is positioned above a ground structure or means 810 for grounding electrical current. The ground structure 810 may include central hub 811, a plurality of main spokes 812 radiating from hub 811, a plurality of secondary spokes 814 branching off of main spokes 812, and a plurality of gaps 813 between the secondary spokes 814. The secondary spokes 814 and gaps 813 may be oriented perpendicularly to the current flow in the portion of inductor 800 positioned over the spokes 814 and gaps 813. The perpendicular orientation of the spokes 814 and gaps 813 are configured and may be sized to increase the dampening effect of the ground structure 810 on eddy currents and parasitic capacitance produced by the square-shaped inductor in the transformer 800 while still providing heat dissipation for the heat that may be produced by the inductor in the transformer 800 and/or a semiconductor package housing the square-shaped inductor in the transformer 800 and ground structure 810. The number, size and configuration of the spokes 812 and 814 and gaps 813 may be based on the amount of current and/or the size of the inductor in the transformer 800 coils and need not be uniform or substantial similar.

Figure 9A:
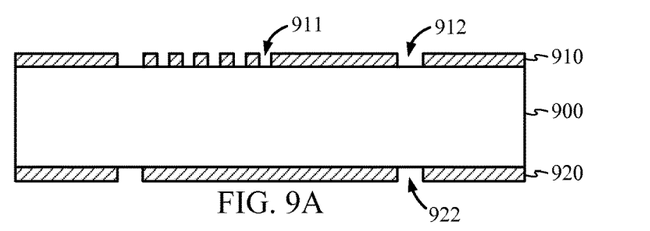
FIGS. 9A-E depict a process flow for forming an exemplary patterned ground.

In accordance with some examples of the disclosure, FIGS. 9A-E depict a partial process flow for formation of a patterned ground. As shown in FIG. 9A, the partial process flow depiction begins from a point where the ground body already has a patterned etching mask or layer applied to a top and bottom of the ground body. As shown in FIG. 9A, a ground body 900 has a first etch mask 910 on a top of the body 900 and a second etch mask 920 on the bottom of the body 900. Body 900 may be composed of an etchable material that provides a ground path for electrical currents as well as heat dissipation. The body 900 may be composed of metal or metal alloys that conduct current and store or conduct heat. The first etch mask 910 is shown already patterned but it should be understood that the patterning may be created by any suitable means. The pattern in the first etch mask 910 may include exposed areas 911 and 912. Exposed areas 911 may be positioned to correspond to the desired location of gaps for the ground structure. Exposed areas 912 and 922 may be positioned to correspond to the desired location of thermal vias for the ground structure. The number and size of the areas 911, 912, and 922 may vary according to the desired gap, ridge, and via pattern and need not be uniform.

Figure 9B:
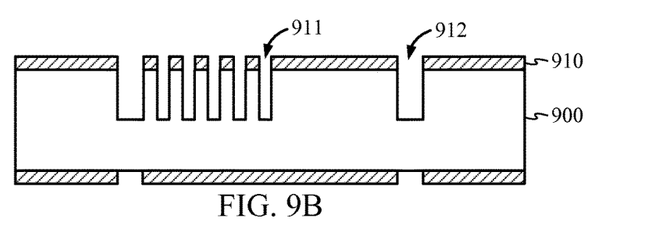

In FIG. 9B, in a next phase of an exemplary process, an etch material may be applied to the first etch mask 910 to partially etch the body 900 in the exposed areas 911 and 912. The depth of the etching may vary according to the desired characteristics and the depth of exposed areas 911 may vary from the depth of exposed areas 912 and need not be uniform for all exposed areas 911. It should be understood that other processes of removal may be used instead of etching such as mechanical or laser means.

Figure 9C:
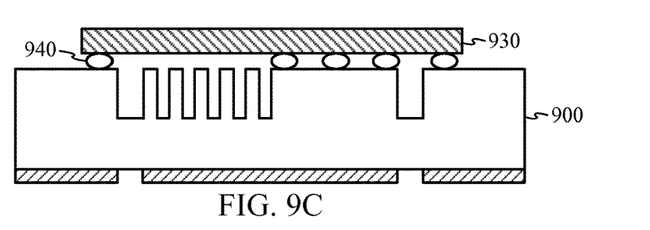

In FIG. 9C, in a next phase of an exemplary process, the etching mask 910 may be removed from the body 900 and a semiconductor die 930 and solder balls 940 may be attached to the body 900 on top of the body 900. It should be understood that this portion of the process may occur later in the process such as after the etching shown in FIG. 9D.

Figure 9D:
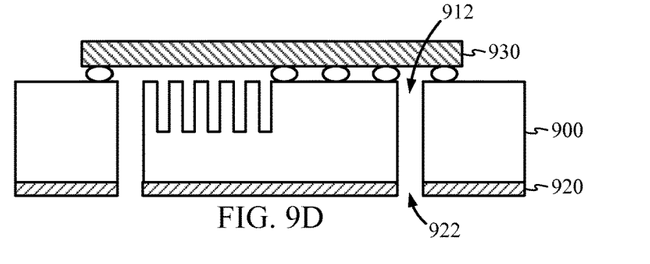

In FIG. 9D, in a next phase of an exemplary process, a second application of etch material may be applied to the second etch mask 920 to partially etch the body 900 in the exposed areas 922. The depth of the etching may vary and may be controlled to completely etch a path from exposed areas 922 to the exposed areas 912. The paths thus created provide a path for heat from above or below the body 900, such as from die 930. Although not shown, the process may continue by removing the etch mask 920 from the body 900 and may include attaching a second ground structure. The process may also include filling one or both of the paths with thermally conducting material fully or partially.

Figure 9E:
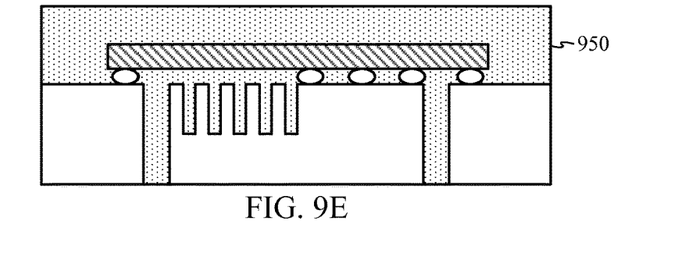

In FIG. 9E, in a next phase of an exemplary process, an encapsulating material 950 may be added to enclose the die 930 and patterned body 900. Although the paths and gaps are shown as filled, the paths and gaps may remain open or filled with material other than the encapsulating material.

It should be understood that although the description above mentions air gaps and hollow thermal vias, substitute materials can be used in place of air. The substitute materials can include a dielectric material for the air gaps and thermally conductive material for the thermal vias uniformly or selectively.

Examples of the methods, apparatus, and systems described herein can be used in a number of applications. For example, the described examples could be used in flip chip packages, flat no-lead packages, LGA packages, and wafer level packages. Further applications should be readily apparent to those of ordinary skill in the art.

Nothing stated or illustrated depicted in this application is intended to dedicate any component, step, feature, benefit, advantage, or equivalent to the public, regardless of whether the component, step, feature, benefit, advantage, or the equivalent is recited in the claims.

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some examples, some or a plurality of the most important method steps can be performed by such an apparatus.

The examples described above merely constitute an illustration of the principles of the present disclosure. It goes without saying that modifications and variations of the arrangements and details described herein will become apparent to other persons skilled in the art. Therefore, it is intended that the disclosure be restricted only by the scope of protection of the appended patent claims, rather than by the specific details presented on the basis of the description and the explanation of the examples herein.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative examples of the disclosure, it should be noted that various changes and modifications could be made herein without departing from the scope of the disclosure defined by the appended claims. The functions, steps and/or actions of the method claims in accordance with the examples of the disclosure described herein need not be performed in any particular order. Furthermore, although elements of the disclosure may be described or claimed in the singular, the plural is contemplated unless limitation to the singular is explicitly stated.

What is claimed is:

1. An integrated circuit package, comprising:
    a first body layer;
    an inductive element positioned above the first body layer;
    a first ground plane on a top of the first body layer between the first body layer and the inductive element and spaced from the inductive element, the first ground plane includes conductive lines generally perpendicular to a magnetic field generated by the inductive element;
    a second ground plane on a bottom of the first body layer opposite the first ground plane; and a hollow via that extends from the first ground plane through the first body layer to the second ground plane, the hollow via located below and horizontally outside a perimeter of the inductive element and configured to thermally couple the first ground plane to the second ground plane such that no vias are within the perimeter of the inductive element.

2. The integrated circuit package of claim 1, wherein the first body layer is a dielectric substrate and the inductive element is in an integrated circuit.

3. The integrated circuit package of claim 1, wherein the first ground plane is electrically isolated from the second ground plane.

4. The integrated circuit package of claim 1, further comprising one of a second via, a solder bump, a copper pillar, or an electrically conductive path extending between the first ground plane and the second ground plane through the first body layer.

5. The integrated circuit package of claim 1, wherein the first ground plane has an area larger than an area of the inductive element.

6. The integrated circuit package of claim 1, wherein the first ground plane has an area smaller than an area of the inductive element.

7. The integrated circuit package of claim 1, wherein the first ground plane includes a solid center portion.

8. The integrated circuit package of claim 1, wherein the second ground plane is a solid body.

9. The integrated circuit package of claim 1, wherein the inductive element is a coupled inductor or a transformer.

10. The integrated circuit package of claim 1, wherein the integrated circuit package is a quad-flat no-leads package and the first ground plane is electrically coupled to the second ground plane.

11. The integrated circuit package of claim 1, wherein the integrated circuit package is a land grid array package or a wafer level package.

12. The integrated circuit package of claim 1, further comprising:
a dielectric layer contacting the first body layer; wherein the inductive element comprises inductive traces; and
wherein the first ground plane conductive lines are arranged in a geometrical pattern substantially inhibiting an inducement of a current in the first ground plane by a current in the inductive element.

13. The integrated circuit package of claim 12, wherein the inductive traces of the inductive element are arranged in a form of a spiral.

14. The integrated circuit package of claim 12, wherein the first ground plane conductive lines comprise conductive line segments oriented perpendicular to the inductive traces of the inductive element.

15. The integrated circuit package of claim 12, wherein the first ground plane has a metal area approximately equal to a metal area of the second ground plane.

16. The integrated circuit package of claim 15, wherein the first ground plane comprises non-conductive lines and the conductive lines.

17. The integrated circuit package of claim 16, wherein the non-conductive lines of the first ground plane have uniform widths with respect to each other and the conductive lines of the first ground plane have uniform widths with respect to each other.

18. The integrated circuit package of claim 17, wherein a width of each of the first ground plane conductive lines is approximately half a width of each of the non-conductive lines.

19. The integrated circuit package of claim 17, wherein a width of each of the first ground plane conductive lines is approximately equal to a width of each of the non-conductive lines.

20. The integrated circuit package of claim 17, wherein a width of each of the first ground plane conductive lines is approximately twice a width of each of the non-conductive lines.

21. The integrated circuit package of claim 17, wherein a width of each of the first ground plane conductive lines is approximately four times a width of each of the non-conductive lines.

22. An integrated circuit package, comprising:
a first body means for providing support;
a third means for transferring energy of an integrated circuit, the third means positioned above the first body means;
a first ground means for grounding electrical current, the first ground means positioned on a top of the first body means between the first body means and the third means and spaced from the third means, the first ground means includes conductive lines generally perpendicular to a magnetic field generated by the third means;
a second ground means for grounding electrical current, the second ground means positioned on a bottom of the first body means opposite the first ground means; and
a hollow via that extends from the first ground means through the first body means to the second ground means, the hollow via located below and outside a perimeter of the third means and configured to thermally couple the first ground means to the second ground means such that no vias are within the perimeter of the third means.

23. A ground structure for an integrated circuit package having an inductive element, the ground structure comprising:
a first body layer positioned below the inductive element;
a first ground plane on a top of the first body layer between the first body layer and the inductive element and spaced from the inductive element, the first ground plane includes conductive lines generally perpendicular to a magnetic field generated by the inductive element;
a second ground plane on a bottom of the first body layer opposite the first ground plane; and
a hollow via that extends from the first ground plane through the first body layer to the second ground plane, the hollow via located below and outside a perimeter of the inductive element and configured to thermally couple the first ground plane to the second ground plane such that no vias are within the perimeter of the inductive element.

* * * * *